United States Patent
Garani et al.

(10) Patent No.: US 8,055,973 B2
(45) Date of Patent: Nov. 8, 2011

(54) CHANNEL CONSTRAINED CODE AWARE INTERLEAVER

(75) Inventors: Shayan Srinivasa Garani, San Diego, CA (US); Nicholas J. Richardson, San Diego, CA (US); Xinde Hu, San Diego, CA (US); Sivagnanam Parthasarathy, Carlsbad, CA (US)

(73) Assignee: STMicroelectronics, Inc., Coppell, TX (US)

( * ) Notice: Subject to any disclaimer, the term of this patent is extended or adjusted under 35 U.S.C. 154(b) by 241 days.

(21) Appl. No.: 12/479,652

(22) Filed: Jun. 5, 2009

(65) Prior Publication Data

US 2010/0313083 A1 Dec. 9, 2010

(51) Int. Cl.
*H03M 13/00* (2006.01)
(52) U.S. Cl. ........................................ 714/755
(58) Field of Classification Search .......... 714/702, 714/755
See application file for complete search history.

(56) References Cited

U.S. PATENT DOCUMENTS

| 4,394,642 A * | 7/1983 | Currie et al. ............ 341/81 |
| 6,771,615 B1 * | 8/2004 | Park et al. ............ 370/318 |
| 7,340,664 B2 * | 3/2008 | Shen ............ 714/755 |
| 7,340,669 B2 * | 3/2008 | Shen ............ 714/786 |
| 7,783,936 B1 * | 8/2010 | Hall et al. ............ 714/701 |

* cited by examiner

*Primary Examiner* — James C Kerveros
(74) *Attorney, Agent, or Firm* — William J. Kubida; Yiu F. Au; Hogan Lovells US LLP

(57) ABSTRACT

An interleaver is constructed based on the joint constraints imposed in the channel and the code domains. A sequentially optimal algorithm is used for mapping bits in the inter-symbol interference (ISI) domain to the code domain by taking into account the ISI memory depth and the connectivity of the nodes within the parity check matrix. Primary design constraints are considered such as the parallelism factor so that the proposed system is hardware compliant in meeting high throughput requirements.

21 Claims, 7 Drawing Sheets

ISW MEMORY ORGANIZATION: EACH DE-INTERLEAVED SUB-WORD IS OF SIZE 152 BITS WITH 136 INFORMATION BITS AND 16 BITS OBEYING THE BY-LANE CONSTRAINTS. THE PARITY BITS ARE INTERSPERSED IN AN 8/9/8/9 ALTERNATING PATTERN.

CHANNEL CONSTRAINED CODE AWARE INTERLEAVER

FIELD OF THE INVENTION

The present invention is related to interleavers, and more particularly, to a channel constrained code aware interleaver.

BACKGROUND OF THE INVENTION

Interleavers provide protection against bursts and media defects by scrambling the coded information in the channel domain. Traditionally, interleavers have always been designed without much consideration about the underlying code. There are many well known interleaver variants such as the s-random interleaver, algebraic interleaver, matrix interleaver, as well as others, that map bits in the ISI domain to bits in the coded domain. The essential principle in these interleaving constructions is that adjacent ISI bits over a certain window length are mapped to non-adjacent bits in the code domain. This rule helps the code to recover information in the event of media defects and burst errors that would flip adjacent bits in the channel domain.

However, when interleavers are used in conjunction with a particular channel code, the scrambling functions must be designed in such a way that the code does not get correlated information from the channel. This makes the interleaver constrained to both the channel and the code specifications and is called a "channel constrained code aware interleaver".

SUMMARY OF THE INVENTION

According to the present invention, a hardware embodiment of the interleaver of the present invention includes a first input path, a second input path, a multiplexer having a first input coupled to the first input path, a second input coupled to the second input path, a control input for receiving a control signal, and an output, a memory having a write input coupled to the output of the multiplexer and a read output, and a FIFO having a write input coupled to the output of the memory and a read output. The first input path includes a memory access interface coupled to a multiplexer and write mask block. The multiplexer and write mask block is also coupled to the read output of the memory. The first input path is coupled to a code memory. The code memory is coupled to a de-multiplexer having an input for receiving serial data. The de-multiplexer is coupled to the first and second shift registers for providing sub-circulant addresses. The second input path includes a sequential address generator. The memory includes a first RAM bank and a second RAM bank. The FIFO includes a plurality of FIFO stages for providing interleaver addresses for the write and read sides. There are two instances where addresses are needed at the read side and an instance where addresses are needed at the write side. Further, since there are de-interleaver and interleaver operations at both read and write sides, there are corresponding FIFO stages to support them. The hardware embodiment of the interleaver according to the present invention further includes a control block for receiving a mode control signal, and for controlling the memory and the FIFO. The control block further receives signal as to which FIFO must be selected depending upon the de-interleaver or interleaver operation performed in the decoder or the encoder side. The control block is coupled to an address count block for providing an interleaver address count.

BRIEF DESCRIPTION OF THE DRAWINGS

The above and other objects, features and advantages of the present invention will become apparent from the following description of the preferred embodiment in conjunction with the accompanying drawings, wherein.

DETAILED DESCRIPTION

Figure 1:
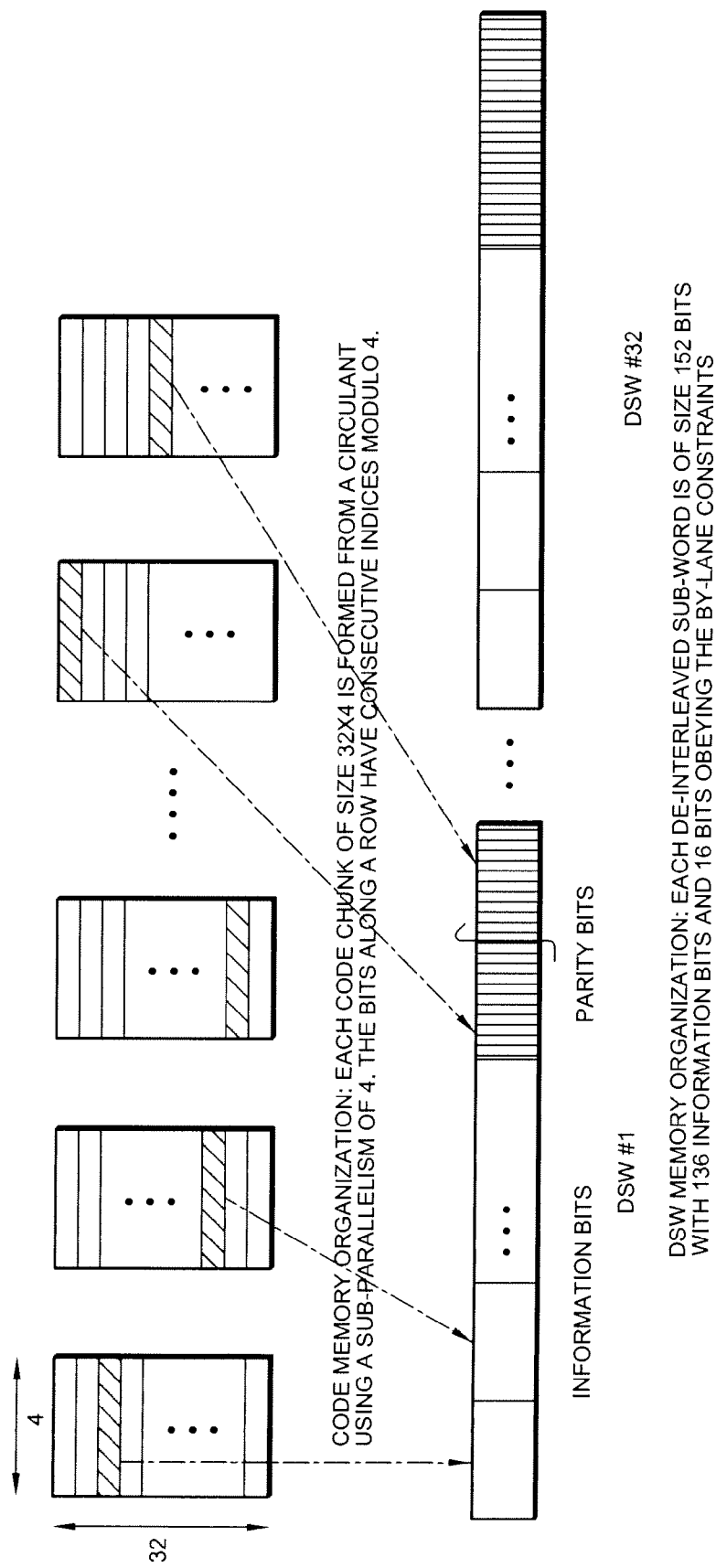
FIG. 1 is an example of a particular interleaver memory organization suitable for use in the interleaver of the present invention.

The constraints and memory organization of the code aware interleaver according to the present invention are now described. In particular, the joint constraints in the design of a practical code aware interleaver are described and a sequential algorithm that describes the mapping function is developed.

Let the channel memory depth be $\delta$. Let $f: x^{(n)} \rightarrow y^{(n)}$ be the mapping of 'n' bits $x^{(n)}$ from the ISI domain to $y^{(n)}$ in the code domain.

The bits in the channel domain are correlated due to ISI. Thus consecutive bits in the channel domain should not be mapped to the bits that are correlated in the code domain. It has been a widely accepted notion that keeping the spreading in the code domain is helpful. On the contrary, this notion/definition of the role of interleaving is rather heuristic and adhoc. As described below, the definition of correlation in the code domain largely depends on the code or rather the decoding algorithm in question. Let $\{x(i)\}_{i=n-\delta}^{n}$ be the consecutive bits in the ISI domain. The channel spreading constraints simply imply that $$y(n) = f(x(n)) \neq \bigcup_{i=n-\delta}^{n} x(i). \qquad (1)$$

It is imperative that larger the value of $\delta$, the better would be the de-correlation between the adjacent bits in the code domain after the interleaver mapping.

For example, suppose there are ISI indices $I_x=(1,2,3,4,5,6,7,8)$. Letting $\delta=2$, n=8 the coded indices satisfying the constraint equation (1) could be $I_y=(5,6,7,8,1,2,3,4)$.

The decoder operates on the interleaved bits from the detector. Let us consider the LDPC ("Low-Density Parity-Check") code for this purpose. The code is characterized by a parity check matrix H of dimensions (n−k)×n whose rows are the check nodes and columns are the variable nodes [1]. Let $c=[c_1 c_2 \ldots c_{n-k}]$ denote the vector of check nodes. Let $v=[v_1 v_2 \ldots v_n]$ denote the variable nodes. Let $\{v_m^{(i)}\}:|\{v_m^{(i)}\}=\deg(c_i)|$ be the set of variable nodes connecting check node $c_i$ with degree $\deg(c_i)$. The check nodes must get information from variable nodes that are not correlated. Thus the adjacent indices in the ISI domain up to a depth $\delta$ must not map into any of the variable nodes connecting a check node.

The above rule can be succinctly described as:

$$y(v_m^{(i)}) \notin \bigcup_{k=f^{-1}(v_m^{(i)})-\delta}^{f^{-1}(v_m^{(i)})-1} x(k), \forall v_{m'}^{(i)} \in c_i, m' \neq m. \quad (2)$$

Equation (2) is now a "tighter" constraint compared to (1) since any variable node connecting a bit node must not be mapped to consecutive ISI indices up to a memory depth $\delta$.

For example, consider the parity check matrix:

$$H = \begin{bmatrix} 01010100 \\ 11000000 \end{bmatrix}$$

Let $I_x=(1,2,3,4,5,6,7,8)$ and $\delta=2$. The set of code indices satisfying the constraint equation (2) is $I_y=(7,2,3,5,6,8,6,1)$.

In addition to the parity check matrix constraint based on equation (2), additional constraints can be imposed based on specific error events/trapping sets that the code sees.

An interleaver that incorporates system performance constraints and is tailored made to it is in principle a constrained interleaver.

In order to meet the throughput requirements for high speed applications, the data is multiplexed into parallel streams and each stream is handled separately. This is called the "design multiplexed rate" ($1/\lambda$). Let $x=[x_1 \, x_2 \ldots x_t]$ be a uniformly partitioned block of ISI bits with each interleaved sub-word $x_i$ of length n/t. The interleaved sub-word (ISW) is divided into $\lambda$ interleaved bit-lanes of equal length. A hardware friendly requirement translates to the fact that the interleaver must have the same density of parity and information bits across the interleaved sub-word.

The hardware constraints are stated below.

The bit lanes $0, 1, \ldots, \lambda-1$ contain bits with indices that are mod($\lambda$)+i, i=0, 1, $\ldots$, $\lambda-1$ respectively. This is called this the by-lane rule.

The parity bits must be evenly distributed in all the bit lanes.

Parity bits can be placed anywhere in the ISW as long as the runlength-limited (RLL) constraints are almost always obeyed.

In addition to the above constraints, it may be desired that the interleaver be programmed algorithmically through a reduced set of mappings so that the performance and the hardware needs are met.

The memory organization for the LDPC based interleaver memory organization is described below. This memory organization is not only useful to model the hardware constraints but also serves as the backbone to devise an algorithm that works with the hardware specifications with all possible options that serve as a tradeoff between performance and design.

With respect to FIG. 1, an example of a particular interleaver memory organization is now considered. Consider a quasi cyclic code with parameters ($n_r$, $n_c$, p) corresponding to the number of block circulants in a row $n_r$, column $n_c$ and a parallelism p respectively. The interleaver memory organization is highlighted considering architecture [1], [2] in mind for the specific case of sub-parallelism factor $\kappa=4$. The code memory depth $$D = \frac{p}{\kappa}.$$

The code memory is organized as $n_c$ chunks, each of size $D \times \kappa$. The first $n_c-n_r$ chunks correspond to the information bits and the remaining $n_r$ chunks correspond to the parity bits.

The de-interleaved sub-word memory (DSW) memory comprises of chunks of bits that have information and parity bits chosen from the code memory in such a way a chunk of consecutive $\kappa$ bits is randomly chosen from each code memory chunk. It is important to note that using shift register logic, the hardware can be simplified in the choice of such a random selection based on a mother pattern. Each DSW chunk has $\kappa n_c$ bits and there are totally $$\frac{n}{\kappa n_c}$$

such DSW chunks.

The bits from the DSW memory are then mapped to ISW memory based on the architectural constraints and the rules for mapping DSW chunks to ISW chunks.

Figure 2:
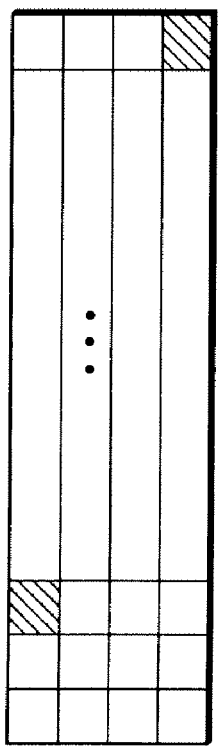
FIG. 2 is an example of a particular interleaver mapping according to the present invention.
Figure 2:
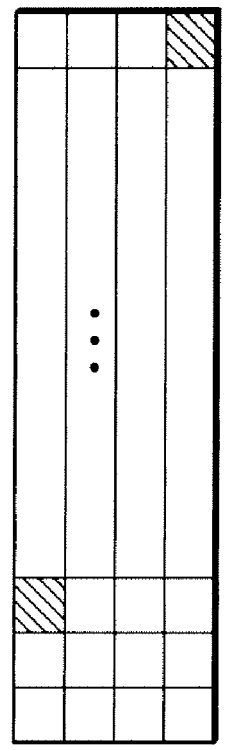

With respect to FIG. 2, the following rules are obeyed to obtain the interleaver mapping.

1) A bit contained within the DSW chunk must be mapped to a bit within the corresponding ISW chunk.
2) The by-lane rules must be obeyed in the mapping from step 1.
3) Code based/error event constraints must be taken into account in addition to meeting steps 1 and 2.

An example of a particular code aware interleaver algorithm according to the present invention is now described. The mapping of bits from DSW memory to the ISW memory constitutes the interleaving algorithm. The interleaving algorithm is sequential in nature and produces a valid mapping satisfying all the constraints provided that a solution is available.

The key steps in the procedure are:
1) Identify the parity locations based on the interspersing criterion and the by-lane rules and map the parity bits in the DSW memory to the ISW memory.
2) Identify information indices within the ISW memory that are by-lane constrained.
3) Subject to the appropriate by-lane in Step 2, identify the indices in ISW domain that satisfy code constraints according to equation (2) or any trapping set based constraints.
4) Map the indices in the DSW domain obeying the by-lane constraints to a set of valid indices in Step 3.

The complexity of such a searching technique is linear in the number bits processed. As such, with a code length n, the algorithm will either terminate with a solution in O(n) steps or not produce a solution. In order for the system to have a solution that may weakly violate a few code based constraints, a certain threshold $\tau$ is forced on the number of violations that may be allowed. This design allows us to study the performance versus hardware complexity tradeoffs for several solutions.

Outline of the Algorithm

```
// Local mapping over ISW chunks
Do over all ISW chunks
    Obtain the locations in the ISW domain for parity and information
    bits.
    Identify the parity bits and information bits in the DSW domain
// Parity mapping
Do over all parity indices in ISW domain
    Identify parity indices p_ISW mod(λ) in ISW domain.
    Identify parity indices p_DSW mod(λ) in the DSW domain.
    Map indices p_DSW mod(λ) → p_DSW mod(λ).
End
// Information bits Mapping
Do over all information indices in ISW domain
    Identify information indices I_ISW mod(λ) in ISW domain outside
    of the interspersed parity locations. Let this be P.
    Identify information indices I_DSW mod(λ) in the DSW domain.
    Do over each index i ∈ I_DSW mod(λ)
        Identify locations within I_ISW mod(λ) not already used. Let
        this set be I_1.
        Based on the constraints, identify locations within I_1 such
        that equation (2) is satisfied. Local trapping set constraints
        at this stage can also be defined. Let this set be I_2.
        If |I_2| ≠ ∅
            Map index i → i' ∈ I_2.
        Else
            If |P − I_1| ≦ τ
                Map index i → i' ∈ I_1. // Weak constraints
            Else
                Return. // There is no solution satisfying all constraints.
            End
        End
    End
End
End
```

Figure 3:
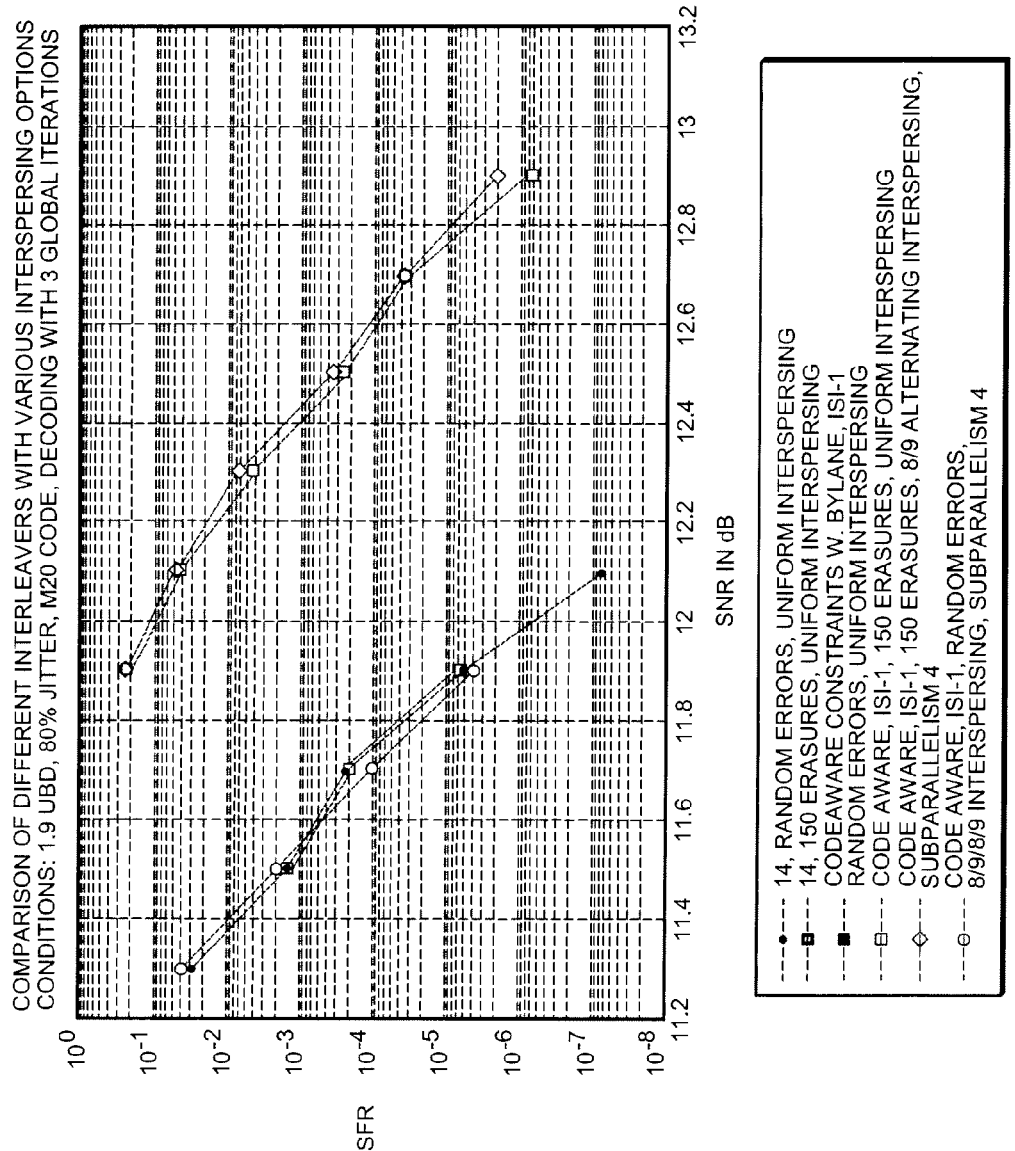
FIG. 3 is a simulation performance curve according to the present invention.

With respect to FIG. 3 a simulation performance curve is shown according to the present invention. In order to study the efficacy of the technique of the present invention, consider the two cases of errors in simulations: random errors and erasures. FIG. 3 shows the performance curve for 1.9 UBD (User Bit Density), 80% jitter condition with the M20 code (a quasi-cyclic code low density parity check code with column weight four) and comparisons with the I4 interleaver. The I4 interleaver is an algebraic interleaver. There is a slight gain in the waterfall region and also comparable performance with the erasures. Typically in magnetic recording schemes, sector failure rate as a function of the signal-to-noise ratio of the recording medium is of interest. FIG. 3 shows that an efficient interleaver can be tailored and still get additional benefits due to the code aware scheme.

Constrained interleaving takes into account considerations of the code, channel memory and the hardware requirements. The framework of constrained interleaving according to the present invention can be tailored to handle a wide variety of constraints and has a firmer theoretical basis towards interleaver design than adhoc schemes. The performance of the design according to the present invention was simulated over the magnetic recording channel and slight gains over the random error case and comparable performance with erasures were observed.

Figures 4, 4A:
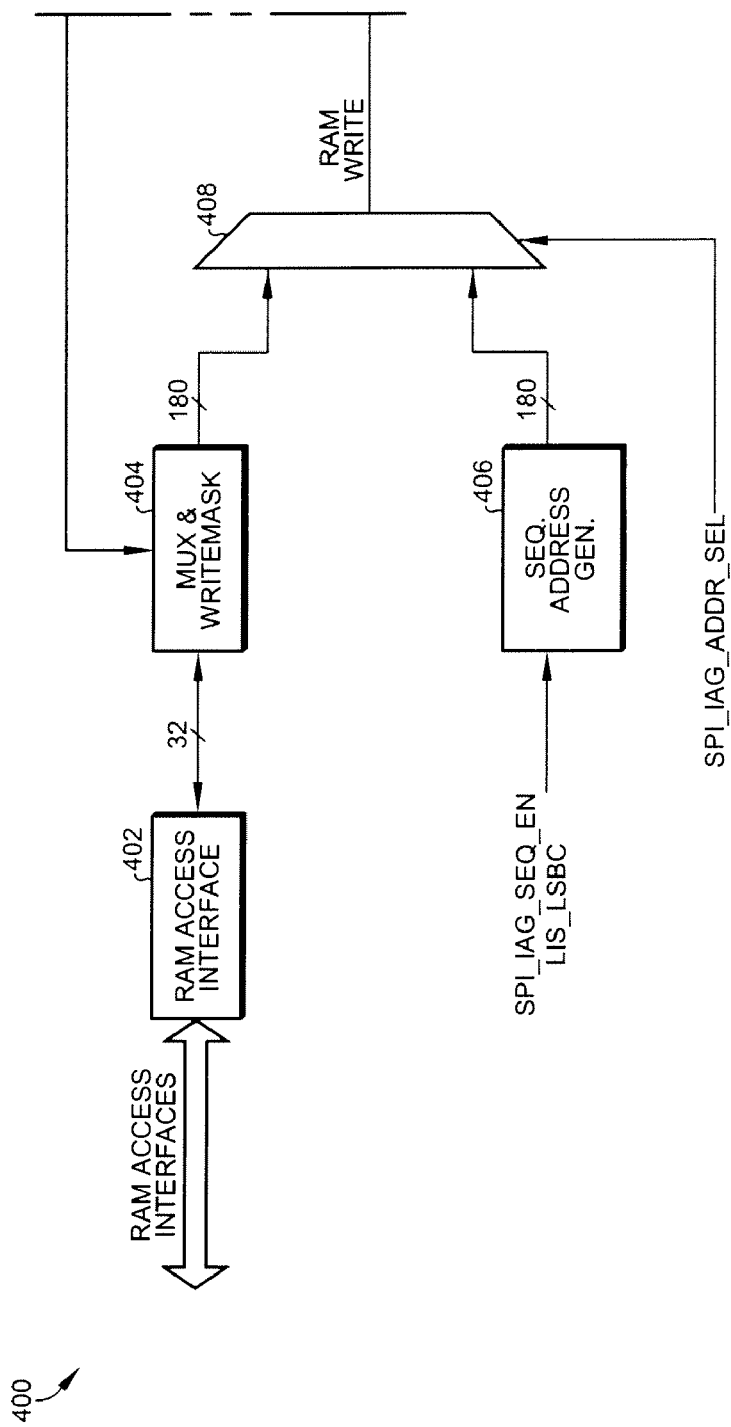
FIG. 4 is a top-level block diagram of the interleaver address generation logic according to the present invention.
Figure 4B:
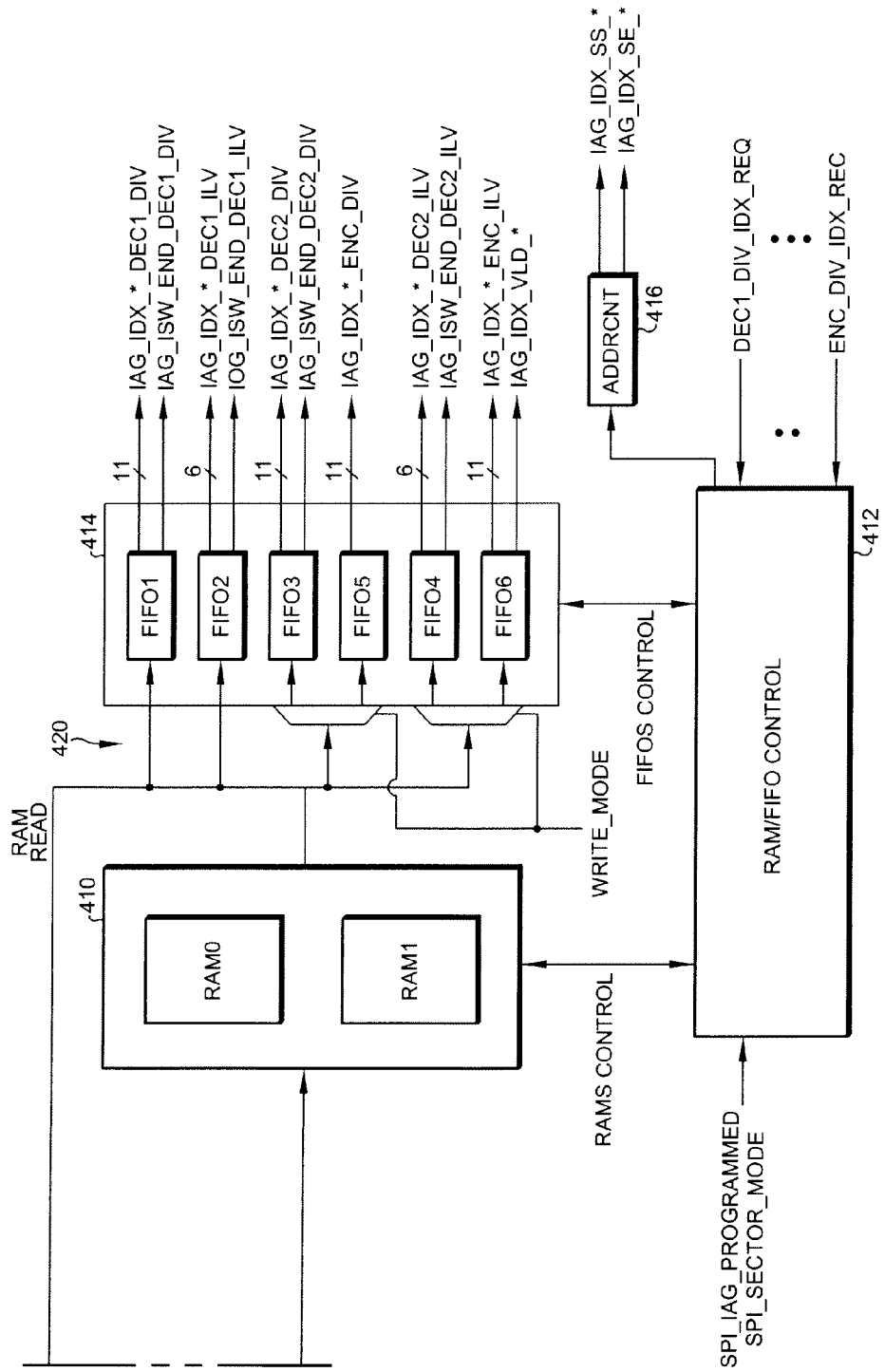

According to a hardware embodiment of the present invention, additional details on the block diagram and circuit for realizing the code-aware interleaver are provided. FIG. 4 shows the top-level block diagram of the interleaver address generation (IAG) block. The IAG block stores pre-computed interleaving addresses in the RAM and provides the address pattern to each interleaver and de-interleaver as per its request. The block diagram of an interleaver 400 includes a RAM access interface block 402, a multiplexer and write mask block 404, a sequential address generator 406, a multiplexer 408, a RAM block 410 including first and second RAM memory blocks RAM0 and RAM1, a RAM/FIFO control block 412, a FIFO block 414 including a plurality of FIFOs FIFO1-FIFO6, and an address count block 416. The RAM access interface block 402 is preferably a parallel interface that reads four addresses at a time corresponding to a quarter rate design. This interface can be programmable to handle half rate or a higher rate. The multiplexer and writemask block 404 is preferably a logic that monitors the data as to which FIFO must be fed into and is used to feed data from the RAM once every preset clock cycles (example: 180 bits once in four clock cycles for a quarter rate design). The sequential address generator is preferably an algorithmic way for generating non-code-aware design patterns and is used for supplying interleaver addresses. Multiplexer 408, RAM block 410, and FIFO block 414 can be of conventional design. RAM/FIFO control block 412 is preferably a logic and is used to arbitrate the selection of the correct FIFO for transferring the data from the RAM. Address count block 416 is preferably a counter and is used to signal sector start and sector end. The logic in 420 indicates multiplexers that are used to select between FIFO3 and FIFO5 and FIFO4 and FIFO6. When the write is high FIFO5 and FIFO6 are selected. Except for FIFO1 and FIFO2, the others are shared between the write path and the second instance of the decoder.

There are two modes for operating the hardware interleaver 400 shown in FIG. 4.

In a first mode, the pre-computed addresses from the an external algorithm described above that satisfy the channel constrained code aware constraints are stored in a memory and then loaded into the two random access memories (RAM 410) shown in FIG. 4 sequentially over the ISW chunks. Each RAM block is of size $$\left(\frac{n\kappa}{p}\right) x(\kappa b),$$

where n is the code length and 'b' is the number of bits needed to represent each address. In the example shown in FIG. 4, the RAM size is 152×180 corresponding to a sub-parallelism κ of 4 and a code parallelism/circulant size of p=128. The logic for generating the addresses conforms to certain constraints as follows. Each consecutive address is modulo κ in accordance with the code memory organization as shown in FIG. 4.

- The addresses must obey by-lane rules. These constraints are explained above. These are required by the hardware since four addresses are accessed at a time to support a ¼ rate design. This simply implies a throughput scale factor of four.
- The addresses will obey the channel constraints by construction according to constraints explained above.

Figure 5:
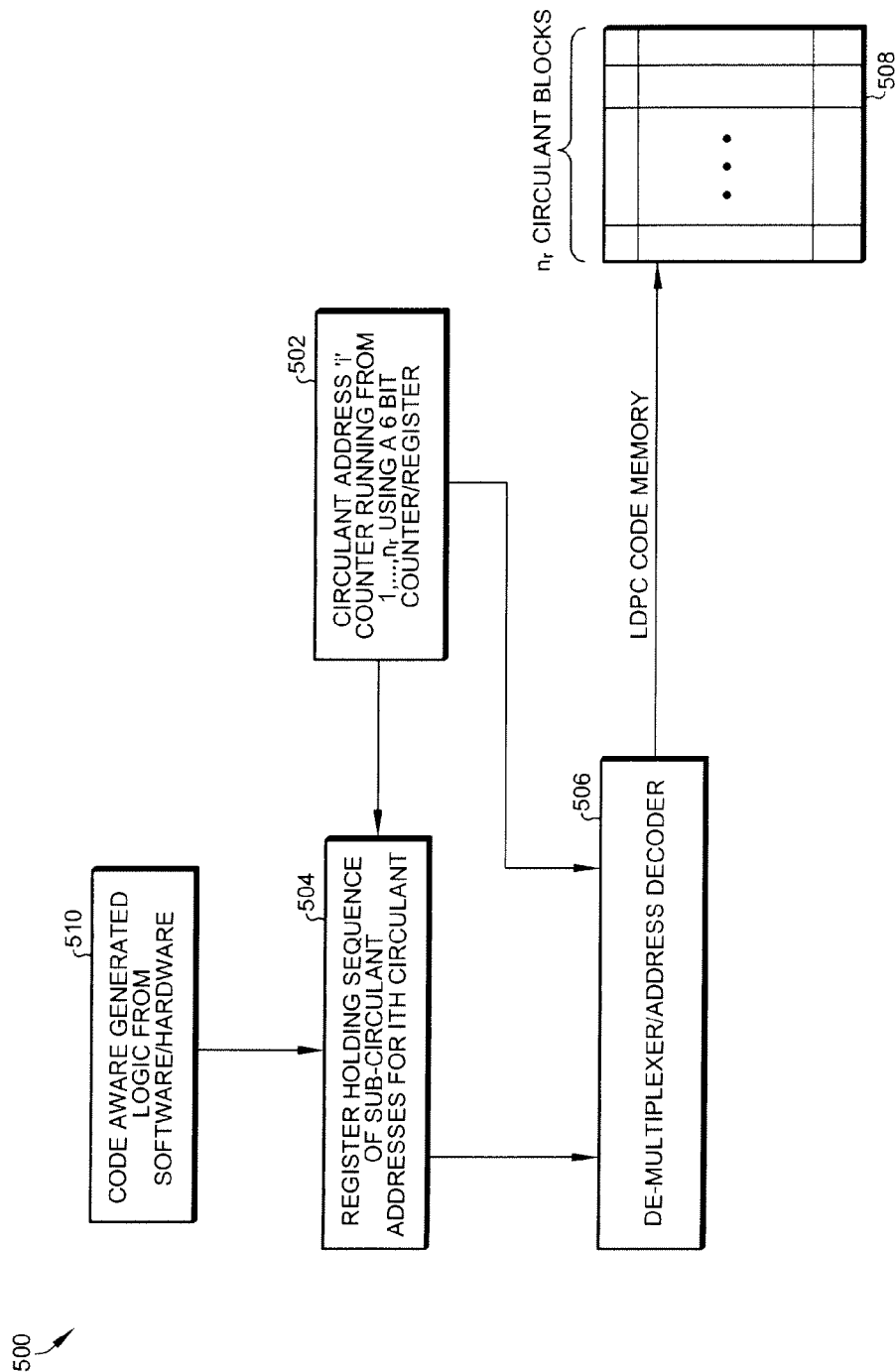
FIG. 5 is a block diagram of circuit for an automatic generation of interleaver addresses using the by-lane option according to the present invention.

In a second mode, the addresses are automatically generated through a hardware logic circuit 500 shown in FIG. 5 that obeys the hardware constraints. This is called the by-lane interleaver, and is explained with reference to FIG. 5. The circulant addresses $0, 1, 2, \ldots, n_r$ are generated through a 6 bit shift register 502 with a pre-programmed seed that indexes the RAM code memory horizontally. Addresses that are greater than 37 are ignored. The sub-circulant addresses are stored in register $\log(n_c)$ bit long 504 containing $n_c$ unique different addresses $0, 1, 2, \ldots, n_c-1$ for the corresponding circulant address from $0, 1, 2, \ldots, n_r$. The horizontal and vertical addresses are de-multiplexed to position the nibbles of data serially obtained from the channel in the RAM of the code memory using de-multiplexer 506. The output of the de-multiplexer 506 is received by the RAM code memory 508. This second mode still obeys the hardware constraints the first mode can support and is called the by-lane interleaver that in some way is automated. It is important to note that in the second mode of operation the circulant and sub-circulant addresses are generated from an external logic to drive the address selections.

It is possible to switch to the first mode by having a RAM based option in the event of encountering any error floor situations due to special trapping sets. The first mode has all the advantages of hardware constraints since it is naturally constructed taking hardware by-lane rules into account in addition to the code constraints. But since the interleaver locations are stored in the RAM, additional storage is required with the first mode. However, the second mode needs no additional storage since the procedure is automated through special hardware logic driven from addresses generated from code aware logic 510. Thus in normal operations the second mode of operation is effective and the first mode is an additional provision that can be decided at the time of read channel operation depending on the user needs.

In order to achieve high speed and zero-latency, the interleaving operations happen within the RAM of the code memory. Thus, additional storage is not needed to go back and forth between the channel and the code domains that would otherwise render the system to have latency equal to the code-word length. This scheme has zero-latency since the interleaver is effectively embedded in the low density parity check (LDPC) code memory RAM.

The advantages of this interleaving apparatus are obviously clear:

Since the interleaver directly operates within the code memory of the underlying channel code, the interleaver has zero latency since it is unnecessary to go back and forth between the channel and code domains.

By-lane constraints are followed with a ¼ rate design and thus the system is four times faster. The hardware depicted can be arbitrary tweaked to any 1/n rate design.

The first operating mode has provisions for handling RAM based interleaver that is code and channel aware making it suited for read channel applications particularly to handle special configurations tailored for error floor regions. This is the first time design of an algorithm having a novel interleaver-code combination and a hardware that supports it using a RAM based scheme.

The granularity of κ=4 is a balanced tradeoff to the κ=1 random code-interleaver combination to obtain an efficient hardware with the performance needs.

Figure 6:
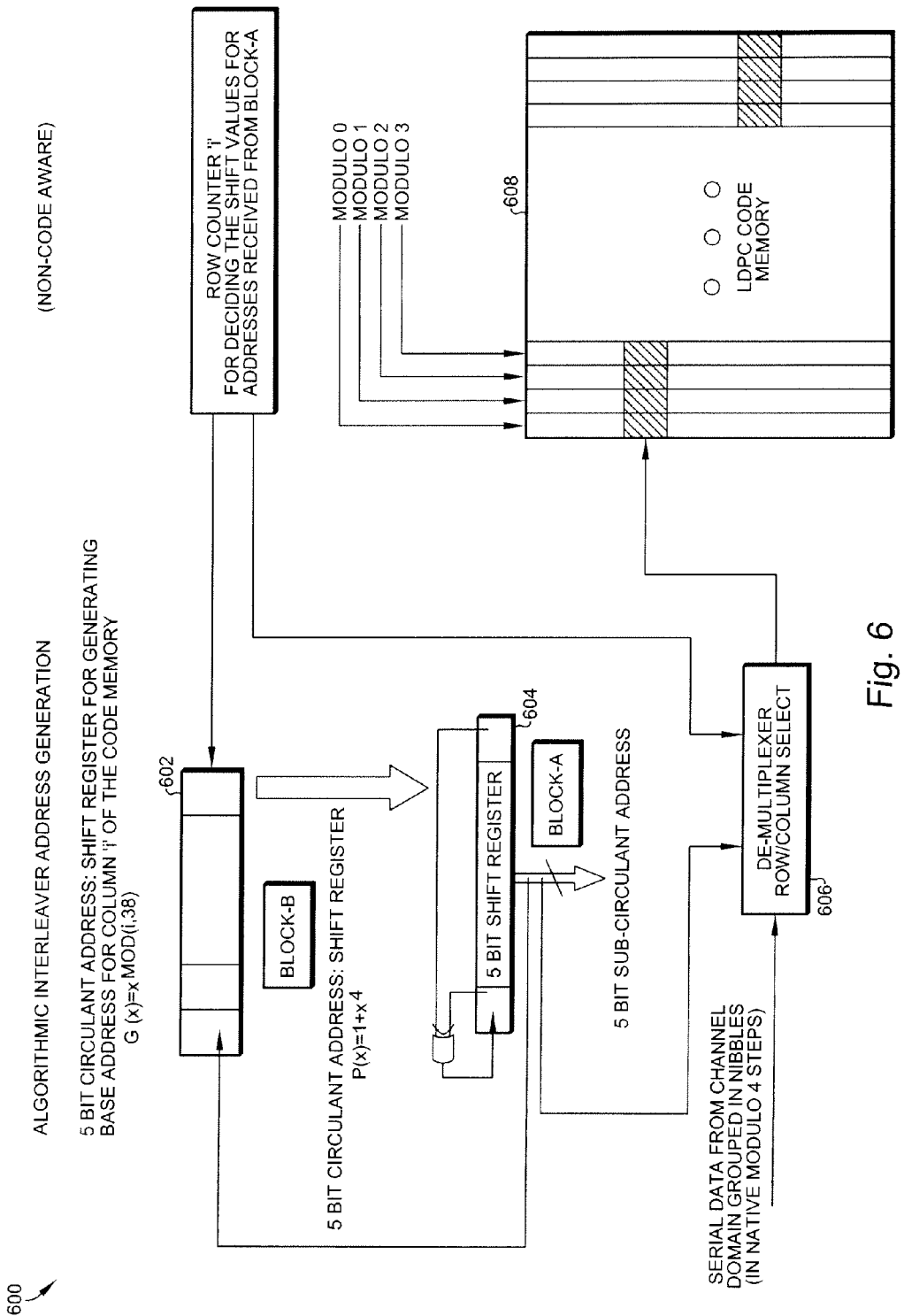
FIG. 6 is a block diagram of an alternative circuit for an automatic generation of interleaver addresses using the by-lane option according to the present invention.

An additional option for algorithmic interleaver address generation (Non-code aware) is shown in FIG. 6. As an example with $n_c=32$ and $n_r=38$, the interleaver address generator 600 includes a shift register 602, a 5 bit shift register 604, a de-multiplexer 606, and a code memory 608. The polynomial in Block-A i.e., P(x) is not restricted to $1+x^4$. In fact any primitive polynomial of order 'n' that can generate $2^{n+1}$ addresses will do the job for this hardware. The key point to note that since there is no extra buffer between the addresses from the interleaver to the LDPC code memory 608, the system has zero latency.

Although an embodiment of the present invention has been described for purposes of illustration, it should be understood that various changes, modification and substitutions may be incorporated in the embodiment without departing from the spirit of the invention that is defined in the claims, which follow.

We claim:

1. An interleaver comprising:
a first input path;
a second input path;
a multiplexer having a first input coupled to the first input path, a second input coupled to the second input path, a control input for receiving a control signal, and an output;
a memory having a write input coupled to the output of the multiplexer and a read output; and
a FIFO having a write input coupled to the output of the memory and a read output, wherein
the memory comprises a plurality of interleaved sub-word (ISW) chunks, wherein
the ISW chucks are mapped from de-interleaved sub-word (DSW) chunks, wherein
the DSW chunks each comprises bits that have information and parity bits chosen from a plurality of code memory chunks in such a way that a chunk of consecutive κ bits is randomly chosen from each code memory chunk.

2. The interleaver of claim 1 wherein the first input path comprises a memory access interface coupled to a multiplexer and write mask block.

3. The interleaver of claim 1 wherein the multiplexer and write mask block is also coupled to the read output of the memory.

4. The interleaver of claim 1 wherein the first input path is coupled to a code memory.

5. The interleaver of claim 4 wherein the code memory is coupled to a de-multiplexer having an input for receiving serial data.

6. The interleaver of claim 5 wherein the de-multiplexer is coupled to first and second shift registers for providing sub-circulant addresses.

7. The interleaver of claim 1 wherein the second input path comprises a sequential address generator.

8. The interleaver of claim 1 wherein the memory comprises a first RAM bank and a second RAM bank.

9. The interleaver of claim 1 wherein the FIFO comprises a plurality of FIFO stages for providing interleaver addresses for write and read sides.

10. The interleaver of claim 1 further comprising a control block for receiving a mode control signal, and for controlling the memory and the FIFO.

11. The interleaver of claim 10 wherein the control block further receives signal as to which FIFO must be selected depending upon the de-interleaver or interleaver operation performed in the decoder or the encoder side.

12. The interleaver of claim 10 wherein the control block is coupled to an address count block for providing interleaver address count.

13. The interleaver of claim 1 further comprising a plurality of multiplexers between the memory and the FIFO for the purpose of sending data from the RAM to the appropriate FIFO.

14. An interleaver comprising:
an input section that can be configured for a first operating mode or a second operating mode;
a memory having an input coupled to the input section and an output; and
a FIFO having an input coupled to the memory and an output for providing the addresses and the end of interleaver sub word signal to the appropriate read/write side where the interleaving operations are needed, wherein
the memory comprises a plurality of interleaved sub-word (ISW) chunks, wherein the ISW chucks are mapped from de-interleaved sub-word (DSW) chunks, wherein the DSW chunks each comprises bits that have information and parity bits chosen from a plurality of code memory chunks in such a way that a chunk of consecutive κ bits is randomly chosen from each code memory chunk.

15. The interleaver of claim 14 wherein the first operating mode comprises a fixed memory based operating mode where the addresses are generated algorithmically using code aware constraints along with bylane mapping rules.

16. The interleaver of claim 14 wherein the second operating mode is on-the-fly way for generating addresses in real time operating mode.

17. The interleaver of claim 14 wherein the input section comprises a multiplexer.

18. The interleaver of claim 14 wherein the input section is coupled to a code memory.

19. The interleaver of claim 14 further comprising a control block for receiving serial to parallel interface for feeding the addresses depending on the operating mode selected and for controlling the memory and the FIFO.

20. The interleaver of claim 19 wherein the control block is coupled to an address count block for providing starting and the ending addresses for the interleaver.

21. A method of code aware interleaving, comprising:

identifying parity locations and mapping parity bits in a de-interleaved sub-word (DSW) memory to an interleaved sub-word (ISW) memory;

identifying information indices within the ISW memory that are by-lane constrained;

identifying a set of indices in a ISW domain that satisfy code constraints according to equation $$y(v_m^{(i)}) \notin \bigcup_{k=f^{-1}(v_m^{(i)})-\delta}^{f^{-1}(v_m^{(i)})-1} x(k), \forall v_{m'}^{(i)} \in c_i, m' \neq m$$

or a trapping set based constraint; and mapping the indices in the DSW domain obeying by-lane constraints to the set of indices.

* * * * *